Nov. 17, 1964 W. R. WOOD 3,157,829
INTEGRATING AMPLIFIER
Filed Nov. 21, 1961
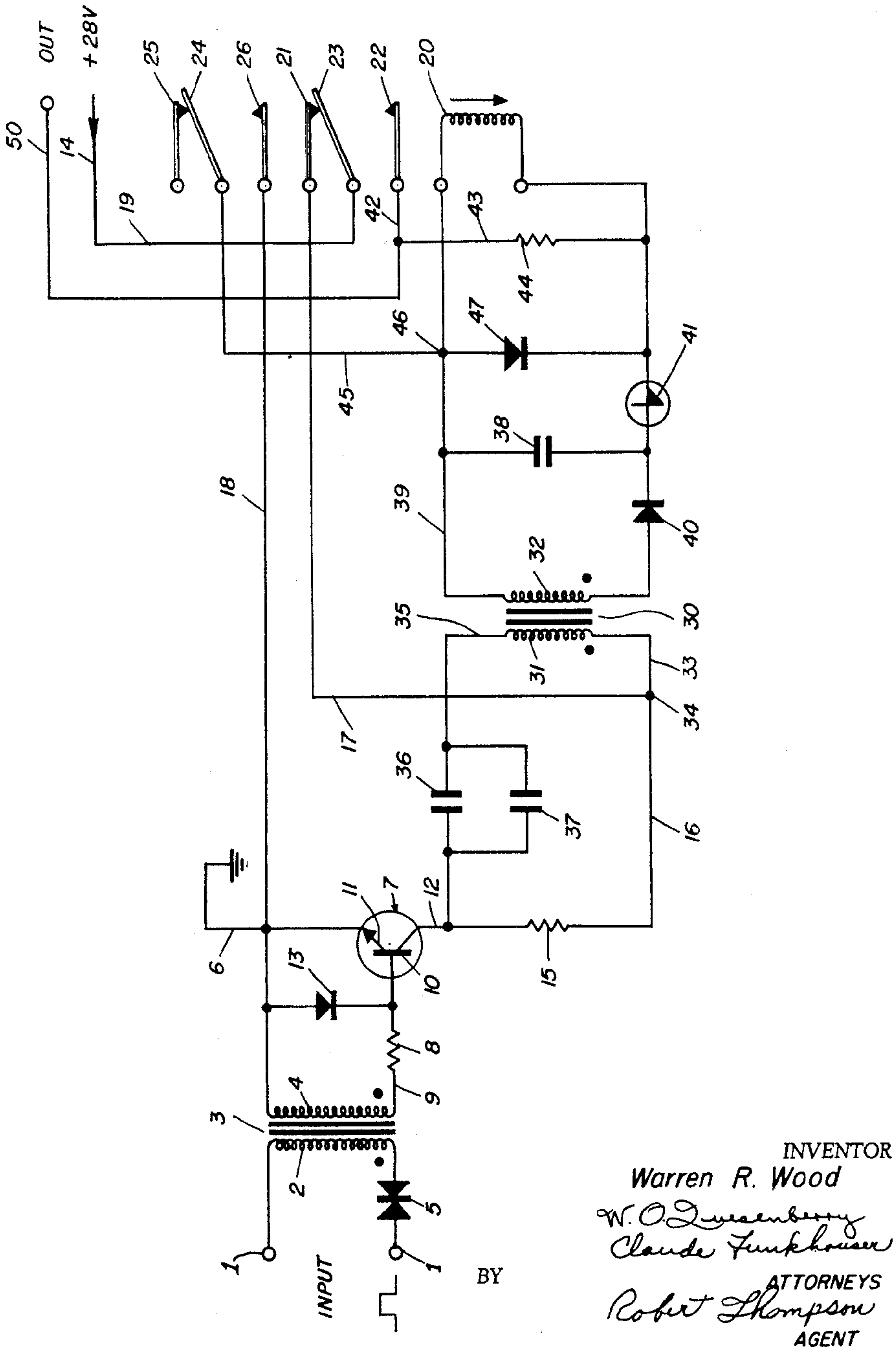
INVENTOR
Warren R. Wood
BY W. O. Quesenberry
Claude Funkhouser
ATTORNEYS
Robert Thompson
AGENT 3,157,829
Patented Nov. 17, 1964

3,157,829

INTEGRATING AMPLIFIER

Warren R. Wood, Palo Alto, Calif., assignor, by mesne assignments, to the United States of America as represented by the Secretary of the Navy Filed Nov. 21, 1961, Ser. No. 154,080
5 Claims. (Cl. 317—151)

This invention relates to a device for integrating a signal and giving an amplified output. More particularly this invention relates to an amplifier for integrating a given number of pulses to give a D.C. output. It is frequently desirable to provide a D.C. output signal to operate equipment or associated circuitry after a given number of pulse signals are sensed. One way of doing this is integration of the pulse signals. But as is usually the case in pulse circuits the pulse signals are of low power while the desired output signal should be of substantial power so that it can operate electrical or heavy duty electronic equipment.

Previous integrating amplifiers have been subject to serious shortcomings and limitations when extreme environmental conditions were encountered. One type of integrating amplifier circuit uses vacuum tubes which have been subject to failure and unreliability when operating under conditions of severe mechanical vibration. This vibration tends to cause shorting and breakdown in the vacuum tube circuits or transistor circuits have been used tion in the heavier circuit elements that are used in conjunction with the vacuum tube circuit. When either vacuum tube circuits or transistor circuit have been used in the past, serious shortcomings have also been encountered where severe temperature extremes have been encountered. The life of vacuum tubes have been greatly shortened and their reliability reduced when subjected to high temperatures. When transistors have been used the degree of reliability is even less than that of vacuum tubes and the reliable operating range greatly reduced.

In prior art devices, one of the elements in the circuit could fail or malfunction and it would still be possible to get an output signal. This erroneous signal could cause operation of the associated controlled equipment at the most inopportune times. Such a time could occur when the firing circuit was set off and the released projectile destroyed nearby equipment. This type of malfunctioning of the equipment could also very easily lead to detection by an enemy force which would otherwise have been an unobserved operation. The present invention overcomes this by having a fail safe arrangement of the elements such that there can be no output signal when any one of the individual elements fail.

This circuit also has an isolation arrangement where erroneous pulse signals and D.C. signals will not affect the circuit arrangement, and because of this isolation feature the circuit will not integrate error signals and therefore give a false output before the proper number of pulses arrive.

An object of this invention is to provide an improved integrating amplifier which will advantageously integrate a series of pulse inputs to control a high power D.C. output.

Another object of this invention is to provide an integrating amplifier which provides a D.C. output when a given number of pulses are received.

Another object of this invention is to provide an integrating amplifier which embodies fail safe arrangement of the circuit elements.

Another object of this invention is to provide an integrating amplifier which will disregard error signals and operate in a fail safe arrangement.

Another object of this invention is to provide an integrating amplifier which will isolate input error signals from the circuit.

Other objects and advantages will appear from the following description of the embodiment of the invention, and the novel features will be particularly pointed out hereinafter in connection with the appended claims.

In the embodiment of the invention illustrated, a pulse input is applied to the input terminals 1 and the primary 2 of the isolation transformer 3. In circuit arrangement between the input terminal and the primary of the isolation transformer is a double anode Zener diode 5 which has a Zener level below the input signal level but high enough so that inadvertent noise signal will not be passed on to the transformer 3. With this arrangement only those, input signals in the proper amplitude range will be passed on to the primary 2 of the isolation transformer 3.

But it is still possible for D.C. error signals which have an amplitude above the Zener level to be passed by the double anode Zener diode 5. To reduce the possibility of this happening the isolation transformer 3 prevents the passing of any D.C. signals to the integrating circuit which might pass the double anode Zener diode 5. Thus the D.C. signal can not in any way affect the integrating circuit following the isolation transformer 3. The secondary 4 of the isolation transformer is connected between the ground 6 and the base 10 of the silicon transistor 7. For more efficient operation of the transistor 7, a resistor 8 is included in circuit arrangement between the output terminal 9 of the isolation transformer secondary 4 and the base terminal 10 of the transistor 7.

The transistor 7 operates as a common emitter class C amplifier. This transistor circuit arrangement has the emitter 11 connected to the ground lead 6 and the collector 12 connected to resistor 15. Connected in a parallel circuit arrangement between the base 10 of the transistor 7 and the ground 6 is a diode 13 which operates to pass any negative error signals which could be conducted through isolation transformer 3. Thus diode 13 operates to prevent any negative error pulses from breaking down the base emitter junction transistor 7 which might cause an error signal to be generated. With this arrangement any current pulses will effectively be circuited directly to ground while positive pulses will not be affected. The unaffected positive pulses will cause an increase in potential between the base 10 and the emitter 11 and cause a current conduction in the transistor. For purposes of simplicity we will treat this current conduction as conventional current and assume that it is in the direction of the arrow on the emitter 11 of the transistor 7. Taking the transistor circuit alone, the emitter 11 is connected to the ground terminal 6 and the collector 12 is connected to the 28 volt power supply terminal 14 through the resistor 15 the line 16 and line 17 through the terminal 21 of the relay 20 and to the power input terminal 14. To simplify the circuit explanation, the flow of minority carriers cross the reverse biased base-collector junction will be ignored. The reason for this is that the portion of the emitter current that flows through collector 12 is on the order of 98% or more of the current flow of the transistor. At the instant when the input pulse signal to the base 10 goes positive, it is sufficient if a proper signal is present to drive the transistor 7 from cut-off to saturation. The resultant forward voltage at this instant is increased, thereby increasing the total current flowing through the emitter 11. By a corresponding amount, the collector and the base current are increased. The increased current flow through the resistor 15 causes the collector end of the resistor 15 to become more negative with respect to the power supply end. For the entire time that the positive pulse is on the transistor base and aiding the forward bias, the output signal on the collector will go negative. This negative output signal has the same wave form as the input pulse to the base and is of the same time duration but of a much higher power and amplitude.

A 4 to 1 step up transformer 30 is connected in circuit relationship to the output of the transistor circuit. One end 33 of the transformer primary 31 is connected to the junction 34 of the D.C. power supply and one of the collector resistor 15. The second end 35 of the step up transformer primary 31 is connected to the collector 12 of the transistor 7 through the coupling capacitors 36 and 37. These capacitors 36 and 37. These capacitors 36 and 37, respectively, are connected in parallel relationship with one another and function as a means for preventing erroneous low frequency impulses from overheating transistor 10. The secondary 32 of the step up transformer 30 is connected in parallel circuit relationship with the integrating or storage capacitor 38. One end of the secondary 32 and the integrating capacitor 38 are connected by the lead 39; the other end of the secondary 32 and integrating capacitor 38 are separated from one another by a silicon diode 40 which acts as a rectifier and to exclude the negative pulses from the integrating capacitor 38. Because of this rectification, only positive pulses which are passed through the rectifier 40 are stored on the integrating capacitor 38. The noncommon end of the storage capacitor has a Shockley diode 41, also known as a four layer or PNPN diode, connected between it and the output relay 20. The Shockley diode 41 has a breakdown potential on the order of 20 volts and when the storage capactor 38 reaches this potential, the capacitor will discharge through the Shockley diode 41 and the resultant current will actuate the relay 20. The discharge from the capacitor 38 is a sufficient duration and power to cause the relay contact arms 23 and 24 to be closed on the contacts 22 and 26 by the armature of the relay 20. When the contacts are closed, D.C. input power will flow through the line 19 to the lower contact 22 through the lines 42 and 43 and through the latching resistor 44. The latching resistor 44 serves to hold the relay 20 in the closed position when the storage capacitor 38 has dissipated all of its power. The other contact 26 of the relay 20 connect the common lead 39 of the integrating circuit to ground 6 through the wires 45 and 18 at junction 46. A diode 47 is connected in parallel circuit relationship with the relay 20 and serves to dampen out any transient signal caused during the switching operation.

It should now be noted that certain safety features such as isolation are presented by the circuit arrangement. As can be seen from the illustrated embodiment, the relay coil 20 is not connected to either ground 6 or the 28 volt terminal 14 until the capacitor 38 has stored a sufficient amount of power and voltage to exceed the breakdown point of the Shockley diode 41. Since the storage capacitor 38 is isolated from the transistor amplifier 7 by the step up transformer 30, it can be seen that the storage capacitor 38 will not reach the desired potential until the proper number and shape pulse have been received. Until the storage capacitor 38 reaches the proper potential the Shockley diode 41 will not discharge and the relay 20 will not operate. Therefore, if any of the circuit elements either singly or in combination fail, no pulses will be impressed on the storage capacitor 38 and therefore the Shockley diode 41 will not discharge.

An added advantages of this circuit is in the use of a relay 20 for the output signal on terminal 50. By using this relay it is possible to use the same current or voltage source for operating the integrating circuit and for the high power required in the electrical devices that the output operates on. By using this arrangement it is possible to use a very low power circuit for a very high power output.

It will be understood that various changes in the details, materials, steps and arrangement of parts, which have been herein described and illustrated in order to explain the nature of the invention, may be made by those skilled in the art within the principle and scope of the invention as expressed in the appended claims.

What is claimed is:

1. A pulse integrating amplifier comprising:
an input terminal means for receiving electrical pulse energy;
a first D.C. isolation means;
an amplitude discriminator means connected in circuit relationship between said input terminal means and said D.C. isolation means for conducting only electrical pulse energy of a predetermined amplitude;
a second isolation means;
amplifier means coupled between said first and said second isolation means for amplifying pulse energy passed by said first isolation means;
an integrating means coupled in circuit relationship to said second isolation means for storing said pulse energy until a predetermined voltage is reached;
a current responsive switch means;
a semi-conductor diode connected to said integrating means and said curernt responsive switch means;
said semiconductor diode providing curernt to operate said current responsive switch means only after a predetermined pulse charge has been stored on said integrating means; and
contact means associated with said current responsive switch means for closing upon actuation of said current responsive switching means.

2. The pulse integrating amplifier of claim 1 wherein the said semiconductor diode comprises a four layer semiconductor device.

3. A fail-safe integrating amplifier circuit wherein an external voltage source is actuated upon reaching a predetermined charge on an integrating capacitor whereby:
pulses received by an integrating means actuates a switching means after a predetermined time comprising:
an input means for receiving electrical pulse energy;
a first pulse coupling means for providing low loss coupling of said electrical pulse energy;
a noise blocking means coupling said input means and said first coupling means in circuit relationship for providing noise elimination from said electrical pulse energy;
first rectifier means for providing clipping of negative pulse energy;
a second pulse coupling means for providing low loss coupling of said electrical pulse energy;
said first rectifier means coupling said first pulse coupling means and said second pulse coupling means in circuit relationship;
a second rectifying means for supplying positive polarity pulses;
integrating means for providing storage of said positive polarity pulses to a predetermined level;
said second rectifying means electrically coupling said second pulse coupling means and said integrating means in circuit relationship; and
predetermined current switching means in circuit relationship with said integrating means with a voltage breakover point for providing conduction of current when a predetermined level of positive charge is stored on said integrating means.

4. An integrator including:
an input means;
a pulse height discriminating means for providing conduction of electrical input signals within a given amplitude;
a first transformer with primary and secondary windings;
said pulse height discriminator means coupling said input means and said first transformer in circuit relationship for conducting said electrical input signals to said primary winding on said first transformer;

a transistorized amplifier means having base, emitter and collector junctions;

said base coupled to said secondary winding of said first transformer;

said emitter coupled to first connector terminal;

a first diode coupled in parallel relationship to said secondary of said first transformer and the base emitter junctions of said amplifier means for providing clipping of the negative polarity signals which are conducted through said first transformer;

a source of potential means connected to said collector junction for supplying potential thereto;

a second transformer with primary and secondary windings;

said primary of said second transformer coupled to said collector junction for receiving output signals from said amplifier means;

an integrating means coupled in parallel relationship with said secondary of said second transformer for providing storage of said output signals;

a second diode for providing a highly conductive path whenever a predetermined breakdown value of potential is reached;

a second common terminal;

a switching means responsive to current conduction;

said switching means associated with a first and second contact means;

said second diode coupled to link said integrating means; said switching means and said second common terminal in circuit relationship to a second common terminal;

said first electrical contact means selectively connecting said second common terminal to said first common terminal upon actuation of said switching means;

said second electrical contact means coupled to said source of potential; and output terminals associated with said second electrical contact means for providing an output voltage at said output terminals upon actuation of said switching means.

5. The integrator circuit of claim 4 wherein the said pulse height discriminator comprises:

a double anode Zener diode for providing noise elimination of predetermined amplitude of noise signal from the electrical input signals.

References Cited in the file of this patent

UNITED STATES PATENTS

| | | |
|---|---|---|
| 1,933,976 | Hanson | Nov. 7, 1933 |
| 2,915,632 | Moore | Dec. 1, 1959 |
| 3,015,042 | Pinckaers | Dec. 26, 1961 |
| 3,018,442 | Goodman | Jan. 23, 1962 |
| 3,021,431 | Wellman | Feb. 13, 1962 |
| 3,030,523 | Pittman | Apr. 17, 1962 |
| 3,056,047 | Cooke-Yarborough | Sept. 25, 1962 |